(12) United States Patent
Uraki (10) Patent No.: US 7,845,768 B2
(45) Date of Patent: Dec. 7, 2010

(54) LIQUID DROPLET EJECTION HEAD

(75) Inventor: Shingo Uraki, Machida (JP)

(73) Assignee: Konica Minolta Holdings, Inc., Tokyo (JP)

( * ) Notice: Subject to any disclaimer, the term of this patent is extended or adjusted under 35 U.S.C. 154(b) by 100 days.

(21) Appl. No.: 12/310,500

(22) PCT Filed: Aug. 2, 2007

(86) PCT No.: PCT/JP2007/065151

§ 371 (c)(1),
(2), (4) Date: Feb. 26, 2009

(87) PCT Pub. No.: WO2008/029574

PCT Pub. Date: Mar. 13, 2008

(65) Prior Publication Data

US 2009/0201345 A1    Aug. 13, 2009

(30) Foreign Application Priority Data

Sep. 8, 2006    (JP) .............................. 2006-244033

(51) Int. Cl.
*B41J 2/045*    (2006.01)
(52) U.S. Cl. ...................................... 347/69
(58) Field of Classification Search .................. 347/69, 347/68, 70–72; 310/311, 324, 358, 360; 400/124.14, 124.16
See application file for complete search history.

(56) References Cited

U.S. PATENT DOCUMENTS

| | | | |
|---|---|---|---|
| 5,933,169 A * | 8/1999 | Sugahara | 347/71 |
| 6,412,924 B1 * | 7/2002 | Ashe et al. | 347/69 |
| 7,677,708 B2 * | 3/2010 | Kitamura et al. | 347/71 |
| 2004/0214723 A1 | 10/2004 | Nonoyama et al. | |
| 2004/0241501 A1 | 12/2004 | Kijima et al. | |
| 2006/0006360 A1 | 1/2006 | Takao et al. | |
| 2007/0008388 A1 | 1/2007 | Yamaguchi et al. | |
| 2008/0060381 A1 | 3/2008 | Kijima et al. | |
| 2009/0020726 A1 | 1/2009 | Uraki et al. | |

FOREIGN PATENT DOCUMENTS

EP    1 457 471 A2    9/2004

(Continued)

OTHER PUBLICATIONS

U.S. Appl. No. 12/310,505, filed Feb. 26, 2009, Confirmation No. 8073.

*Primary Examiner*—K. Feggins
(74) *Attorney, Agent, or Firm*—Holtz, Holtz, Goodman & Chick, P.C.

(57) ABSTRACT

Disclose is a liquid droplet ejection head comprising;
a piezoelectric actuator using a piezoelectric porcelain composition containing no lead and having low temperature dependence of piezoelectric constant, Specifically disclosed is a droplet ejection head characterized by comprising a piezoelectric actuator using a piezoelectric porcelain composition containing a solid solution of a main component represent by the Formula (1) below and a sub-component represented by the Formula (2) below which is added in an amount of less than 1 mol % relative to the total amount of the solid solution.

$\{Li_X(K_{1-Y}Na_Y)_{1-X}\}(Nb_{1-Z-W}Ta_ZSb_W)O_3$,    Formula (1)

wherein x, y, z and W are within the ranges of $0 \leq x \leq 0.2$, $0 \leq y \leq 1$, $0 < z \leq 0.4$, and $0 < w \leq 0.2$, respectively.

$ABO_3$,    Formula (2)

wherein A represents Bi, and B represents at least any one of Fe, In, and Sc.

10 Claims, 4 Drawing Sheets

FOREIGN PATENT DOCUMENTS

| | | |
|---|---|---|
| EP | 1 642 875 A2 | 4/2006 |
| EP | 1 990 326 A1 | 11/2008 |
| JP | 2004244301 A | 9/2004 |
| JP | 2004-300012 A | 10/2004 |
| JP | 2005-228865 A | 8/2005 |
| JP | 2005-246656 A | 9/2005 |
| JP | 2006-205572 A | 8/2006 |

* cited by examiner

↑ POLARIZATION
--→ ELECTRIC FIELD
↪ SHEAR STRESS

LIQUID DROPLET EJECTION HEAD

This application is the U.S. national phase application of International Application PCT/JP2007/065151 filed Aug. 2, 2007.

TECHNICAL FIELD

The present invention relates to a liquid droplet ejection head.

TECHNICAL BACKGROUND

Heretofore, a PZT ($PbTO_3$-$PbZrO_3$) constituent-based ceramic containing lead has been used in a piezoelectric ceramic composition. The reason for it is that the aforesaid PZT, exhibiting excellent piezoelectric properties and a high mechanical quality coefficient, can readily produce materials exhibiting various desired characteristics which are required for various applications such as a sensor, an actuator, and a filter. Further, since the PZT has a high relative dielectric constant, it may also be used as a capacitor.

However, while the piezoelectric ceramic composition composed of the aforesaid PZT exhibits excellent characteristics, it contains lead as an element constituting the composition, leading to a concern that toxic lead is eluted off from industrial waste of products containing PZT to result in an environmental pollution. The increasing awareness of environmental issues in recent years has made it difficult to manufacture the products containing substances such as PZT which have been a cause of environmental pollution. To cope with the above problem, piezoelectric ceramic compositions have been developed which include no lead in their compositions and whose primary component is a chemical compound which is represented by formula $\{Li_X(K_{1-Y}Na_Y)_{1-X}\}(Nb_{1-Z-W}Ta_ZSb_W)O_3$, wherein x, y, z and w are within the ranges of $0 \leq x \leq 0.2$, $0 \leq y \leq 1$, $0 < z \leq 0.4$, and $0 < w \leq 0.2$, respectively (refer to Patent Document 1).

A polarization method has been disclosed in which the first step where a piezoelectric ceramic composition, exhibiting a cubic crystal structure at a high temperature and a reversible phase transition to tetragonal and then to orthorhombic structures when the temperature decreased, is subjected to the first polarization processing, and the second step where the above piezoelectric ceramic composition is subjected to the second polarization processing in a temperature range in which the composition exhibits an orthorhombic structure and in the same direction of polarization as the above first polarization processing are provided in the piezoelectric ceramic composition in which the primary component described above exhibits a perovskite structure of $ABO_3$ type to stably increase and saturate the polarization degree (refer to Patent Document 2).

Further, patent document 3 discloses a liquid droplet ejection head utilizing a piezoelectric actuator whose primary component is a piezoelectric ceramic composition having a perovskite crystal structure and including no lead. It also discloses that the above primary component includes barium titanate, potassium niobate, sodium bismuth titanate, bismuth nickel titanate, $Ba_2NaNb_5O_{15}$, and $Bi_4Ti_3O_{12}$.

Patent Document 1: Japanese Patent Application Publication (hereinafter also referred to as JP-A) No. 2004-300012
Patent Document 2: JP-A No. 2005-228865
Patent Document 3: JP-A No. 2005-246656

DISCLOSURE OF THE INVENTION

Issues to be Solved by the Invention

In recent years, along with expansion of utilization fields of the piezoelectric actuator, stable characteristics of the piezoelectric actuator over a wider temperature range have been demanded. In particular, the temperature stability of a piezoelectric constant which contributes to a piezoelectric displacement has been demanded.

For example, in case where a piezoelectric ceramic composition is employed in the piezoelectric actuator for a liquid droplet ejection head, the piezoelectric actuator is possibly demanded to exhibit stable characteristics over a wider temperature range, for example, as much as from 10 to 80° C., corresponding to the use environment.

However, the piezoelectric ceramic compositions including no lead, which are described in patent documents 1 and 3, have a problem such that improvement in a temperature dependence is not achieved, even if the polarization method disclosed in patent document 2 is employed due to a large temperature dependence of the piezoelectric constant, under present circumstances that the temperature range of the use of the liquid droplet ejection head has been extended to a higher side.

In other words, in case where the piezoelectric ceramic composition exhibiting a large temperature dependence of the above piezoelectric constant is employed, a change of the piezoelectric constant occurs when the temperature changes. Then, there exist a problem that, with the temperature change, displacement properties of the piezoelectric actuator vary to result in changes of liquid ejection properties.

The present invention has been achieved in consideration of such problems, and it is an object to provide a liquid droplet ejection head which is provided with a piezoelectric actuator employing a piezoelectric ceramic composition including no lead exhibiting a small temperature dependence of the piezoelectric constant.

Measures to Solve the Issue

The above issue of the present invention can be achieved by a constitution below.

1. A liquid droplet ejection head wherein there is provided a piezoelectric actuator employing a piezoelectric ceramic composition incorporating a solid solution of a primary component represented by Formula (1) below and a sub-component represented by Formula (2), also below, which is added in an amount of less than 1 mol % of the total amount of the solid solution.

$\{Li_X(K_{1-Y}Na_Y)_{1-X}\}(Nb_{1-Z-W}Ta_ZSb_W)O_3$,  Formula (1)

wherein x, y, z and W are within the ranges of $0 \leq x \leq 0.2$, $0 \leq y \leq 1$, $0 < z \leq 0.4$, and $0 < w \leq 0.2$, respectively.

$ABO_3$,  Formula (2)

wherein A represents Bi, and B represents at least any one of Fe, In, and Sc.

2. The liquid droplet ejection head of Configuration 1, wherein the solid solution exhibits a perovskite structure.

3. The liquid droplet ejection head of Configuration 1 or 2, wherein the piezoelectric actuator is employed as a shear mode piezoelectric actuator utilizing a piezoelectric $d_{15}$ constant.

4. The liquid droplet ejection head of Configuration 1 or 2, wherein the piezoelectric actuator is employed as a deflection piezoelectric actuator utilizing a piezoelectric $d_{31}$ constant.

5. The liquid droplet ejection head of Configuration 1 or 2, wherein the piezoelectric actuator is employed as a push piezoelectric actuator utilizing a piezoelectric $d_{31}$ constant.

6. The liquid droplet ejection head of Configuration 1 or 2, wherein the piezoelectric actuator is employed as a push piezoelectric actuator utilizing a piezoelectric $d_{33}$ constant.

EFFECTS OF THE INVENTION

According to the present invention, by adding a sub-component represented by $ABO_3$ perovskite (Wherein A represents Bi, and B represents at least any one of Fe, In, and Sc.) which is added in an amount of less than 1 mol % of the total amount of the solid solution into $\{Li_X(K_{1-Y}Na_Y)_{1-X}\}(Nb_{1-Z-W}Ta_ZSb_W)O_3$ (Wherein x, y, z and W are within the ranges of $0 \leqq x \leqq 0.2$, $0 \leqq y \leqq 1$, $0 < z \leqq 0.4$, and $0 < w \leqq 0.2$, respectively.) which is a piezoelectric ceramic composition including no lead to form a solid solution, the temperature dependence of the piezoelectric constant of the resulting piezoelectric ceramic composition can be reduced. This allows a change of displacement properties of the piezoelectric actuator of a liquid droplet ejection head which is provided with a piezoelectric actuator employing the aforesaid piezoelectric ceramic composition to be minimized even if temperature change takes place and liquid ejection properties to be stabilized.

DESCRIPTION OF REFERENCE NUMERALS

1: liquid tube
2: nozzle forming member
3: nozzle
6: cover plate
7: liquid supply port
9: substrate

DESCRIPTION OF THE PREFERRED EMBODIMENTS

An embodiment of the liquid droplet ejection head which is provided with the piezoelectric actuator of the present invention will now be described.

The piezoelectric actuator of the present embodiment is characterized in that the piezoelectric actuator employs piezoelectric ceramic composition incorporating a solid solution of a primary component represented by Formula (1) below and a sub-component represented by Formula (2) below which is added in an amount of less than 1 mol % of the total amount of the solid solution.

$\{Li_X(K_{1-Y}Na_Y)_{1-X}\}(Nb_{1-Z-W}Ta_ZSb_W)O_3$, Formula (1)

wherein x, y, z and W are within the ranges of $0 \leqq x \leqq 0.2$, $0 \leqq y \leqq 1$, $0 < z \leqq 0.4$, and $0 < w \leqq 0.2$, respectively.

$ABO_3$, Formula (2)

wherein A represents Bi, and B represents at least any one of Fe, In, and Sc.

First, an embodiment of the piezoelectric ceramic composition of the present invention is described below.

Each component will be described below.

The primary component of the present embodiment is represented by above Formula (1). In the case of $x > 0.2$, $z > 0.4$, $w > 0.2$, $z = 0$, or $w = 0$, piezoelectric properties such as a piezoelectric constant and dielectric properties decrease, whereby a piezoelectric ceramic composition exhibiting desired properties may not be obtained.

Such a primary component can be provided by preparing raw materials containing each metal element as the raw material, and then the materials being sufficiently blended by, for example, a ball mill. Raw materials for the primary component include, for example, $Li_2CO_3$, $Li_2O$, $LiNO_3$, and $LiOH$ as a Li containing compound; $Na_2CO_3$, $NaHCO_3$, and $NaNO_3$ as a Na containing compound; $K_2CO_3$, $KNO_3$, $KNbO_3$, and $KTaO_3$ as a K containing compound; $Nb_2O_5$, $Nb_2O_3$, and $NbO_2$ as a Nb containing compound; $Ta_2O_5$ as a Ta containing compound; and $Sb_2O_5$, $Sb_2O_3$, and $Sb_2O_4$ as a Sb containing compound.

The primary component features a perovskite structure ($ABO_3$), and elemental constitution of the A site corresponds to K, Na and Li, and elemental constitution of the B site corresponds to Nb, Ta, and Sb.

A composition of the perovskite structure becomes a perfect perovskite structure when the stoichiometric ratio between atoms constituting the A site and atoms constituting the B site is 1:1. But in the case of a piezoelectric ceramic composition, it may happen that, in particular, several percent of the amount of K, Na, Li or Sb volatilize during the sintering step, or all constituting elements vary in several percent during the production steps such as a mixing pulverization step or a granulation step. In other words, deviation from a stoichiometric composition may happen due to variation in production.

In response to such a variation in the composition during manufacturing steps, intentional alteration of the ratio of composition of compounded material enables the ratio of the composition of the sintered piezoelectric ceramic composition to vary by ±several percents, specifically by ±3 to ±5%. The similar alteration may be done to, for example, the conventional lead zirconium titanate (PZT), and the compounding ratio may be regulated in consideration of vaporization of lead during sintering or incorporation of zirconia from zirconia balls which is a pulverization medium.

In the piezoelectric ceramic composition incorporating the primary component of the present embodiment, electrical characteristics such as piezoelectric properties do not vary largely, even if the ratio of composition of compounded material is intentionally altered in such a way as mentioned above. Therefore, in the present invention, when the primary components are fitted to the composition formula $ABO_3$ of a perovskite structure, the constitution ratio of atomic elements at the A and B sites can deviate from 1:1 by as much as about ±5 mol % for each site. In order to achieve high electrical characteristics by allowing the amount of lattice defects in a constituted crystal to be reduced, the amount of the deviation of the constitution ratio of the composition is preferably about ±3%. That is, in the constitution represented by formula $\{(Li_X$ $(K_{1-Y}Na_Y)_{1-X}\}_a(Nb_{1-Z-W}Ta_ZSb_W)\}_bO_3$, the primary components are $0.95 \leq a$, and $b \leq 1.05$, preferably $0.97 \leq a$, and $b \leq 1.03$.

In the primary components represented by the above formula, $0 < x \leq 0.2$ is preferable. Since this allows the Li to be an essential component, the sintering of the resulting piezoelectric ceramic composition can be more readily carried out, and at the same time, the piezoelectric properties thereof can be enhanced and Curie temperature Tc can be further increased. The reason for it is that by allowing the Li to be an essential component within the above-described range, the sintering temperature can be decreased, and, at the same time, Li plays a role of a sintering additive, whereby sintered producing a less void substance can be achieved.

In the primary components represented by the above formula, $x=0$ is allowed. In this case, the primary component is represented by $(K_{1-Y}Na_Y)(Nb_{1-Z-W}Ta_ZSb_W)O_3$. Since the piezoelectric ceramic composition incorporating such a primary component does not contain in their raw materials the lightest element of Li as a lithium compound such as $LiCO_3$, variation in properties due to segregation of raw material powder is allowed to be small when the raw materials are blended to produce the above piezoelectric ceramic compositions. In addition, a high relative dielectric constant $\in_r$, as well as a relatively large piezoelectric constant may be realized.

In order to further increase piezoelectric constant and electromechanical coupling coefficient of the resulting piezoelectric ceramic composition, "y" is preferably in the range of $0 \leq y \leq 0.85$, more preferably in the range of $0.05 \leq y \leq 0.75$, further more preferably in the range of $0.35 \leq y \leq 0.65$, and yet further, "y" is most preferably in the range of $0.42 \leq y \leq 0.60$.

In the primary components represented by the above formula, $y=0$ is viable. In which case, Na is not incorporated in the primary component, which results in a decrease of dielectric loss and enhancement of long term stability of dielectric loss of the resulting piezoelectric ceramic composition.

In the primary components represented by the above formula, the total of $z+w$ is preferably in a range of $z+w \leq 0.37$. In which case, piezoelectric properties such as a piezoelectric constant are allowed to be further enhanced.

Next, a sub-component of the present embodiment will be described.

The sub-component of the present embodiment is represented by Formula $ABO_3$, and is a perovskite compound of the $ABO_3$ type, wherein A and B are a metal element exhibiting a valence of +3. Further, the A in the sub-component is an element Bi, and the B contains at least any one of elements Fe, In, and Sc. In order to produce a highly dense sintered substance during the sintering step of a piezoelectric ceramic composition, the amount of the sub-component to be added is preferably less than 1 mol per 100 mol of the total components (total of primary components and subcomponents) after the sub-component has been added.

The sub-component represented by the above Formula (2) may be added to the primary component in the form of a compound constituting a perovskite compound of the $ABO_3$ type, or the sub-component may be added in the step where the sub-component is blended with the primary component in the form of a combination of raw materials which will become an $ABO_3$ type perovskite compound. Compounds which originally constitute a perovskite structure of the $ABO_3$ type include $BiInO_3$, $BiFeO_3$, and $BiScO_3$.

Raw materials which can become an $ABO_3$ type perovskite compound at the blending step include; $Bi_2O_3$ as a Bi containing compound; $In_2O_3$ as an In containing compound; $Sc_2O_3$ as a Sc containing compound; and $Fe_2O_3$ as an Fe containing compound. Highly pure raw materials of at least 99% are preferred.

The sub-component of the present embodiment is an $ABO_3$ type perovskite compound. The atomic element which constitutes the A site is Bi. The atomic element which constitutes the B site is at least any one of Fe, In, and Sc, and the above atomic element is not limited to one metal element but the B site may be constituted with a combination of at least two metal elements thereof.

Further, raw materials of the sub-component may be compounded in a stoichiometric ratio of 1:1 between elements constituting the A site and elements constituting the B site to form $ABO_3$, or the stoichiometric ratio may be allowed to vary by ±several percent in consideration of variation during production such that the metal element such as Bi vaporizes during the sintering step.

Next, a method for producing the piezoelectric ceramic composition of the present embodiment will be described. The method for producing the piezoelectric ceramic composition is not particularly limited, but the production method via a solid phase thermochemical reaction will be described.

First, raw materials of the primary component are prepared and fully dried. The dried raw materials, the weight of each of which being in the stoichiometric ratio of $ABO_3$, are blended via a ball-mill, and then dried. Then, the resulting mixture is calcined at 700 to 1,000° C. to decompose and solidify the raw materials via a solid phase thermochemical reaction. The resulting calcined mixture is wet-pulverized into fine particles having a center of the particle size distribution of about 5 µm, and is dried to produce a calcined powder of the primary component.

Next, raw materials of the sub-component are prepared and fully dried. The dried raw materials, the weight of each of which being in the stoichiometric ratio of $ABO_3$, are subjected to wet mixing to produce a mixed powder of the sub-component.

Subsequently, the calcined powder of the primary component and the mixed powder of the sub-component are compounded so that "v" falls within the range of $0 < v < 0.01$ in formula $[\{Li_X(K_{1-Y}Na_Y)_{1-X}\}(Nb_{1-Z-W}Ta_ZSb_W)O_3]_{1-V}(ABO_3)_V$. The compounded material is fully blended via, for example, a ball-mill, and then dried to produce a blended substance.

The resulting blended substance is calcined at from 700 to 800° C., and then the calcined blended substance is pulverized. An organic bonding agent such as a binder is added to the pulverized substance, which is then granulated and subjected to a pressure molding. The aforesaid pressure molding is preferably carried out in such a manner that the granulated substance made of the above pulverized substance is molded into the form of pellets via uniaxial pressing, and then the resulting pellets are re-molded via a cold isostatic press (CIP).

The compact thus obtained is sintered at from 1,000 to 1,300° C. to produce a sintered product. The resulted sintered product is cut to a predetermined size, which is then subjected to a parallel grinding to form electrodes via sputtering on both sides thereof. Subsequently, in silicone oil at about from 80 to 150° C., direct current voltage of from 1 to 6 kV/mm is applied between the electrodes to polarize them in the thickness direction to produce a piezoelectric ceramic composition.

As stated above, according to the piezoelectric ceramic composition of the present embodiment, addition of at least two metal elements as a sub-component in a combination represented by $ABO_3$ (wherein the A is Bi, and the B is at least any one of Fe, In, and Sc) exhibiting a perovskite structure, significantly decreases a temperature dependence of the piezoelectric constant of the resulting piezoelectric ceramic composition. The reason for such decrease is considered to be that when Bi is added in a form of $Bi_2O_3$ alone, the valence of Bi becomes +5, and the B site tends to be replaced by the Bi, while when Bi is added in a form of a combination of $ABO_3$ (for example, $BiFeO_3$) which is known to exhibit a perovskite structure, the valence of Bi becomes +3, and the A site tends to be replaced by the Bi.

According to a liquid droplet ejection head which is provided with a piezoelectric actuator employing such a piezoelectric ceramic composition, a change of displacement properties of the piezoelectric actuator is small even if temperature change takes place, and liquid ejection properties are stabilized.

The amount of displacement of such a piezoelectric actuator is proportional to the product of the piezoelectric constant and the applied voltage. The liquid droplet ejection head, which allows ejection of liquid, can take various forms by allowing displacement of the piezoelectric actuator, and they will be described below by listing examples of a shear mode type utilizing a piezoelectric $d_{15}$ constant, a deflection type utilizing a piezoelectric $d_{31}$ constant, a push type, and a push type utilizing a piezoelectric $d_{33}$ constant.

Figure 1:
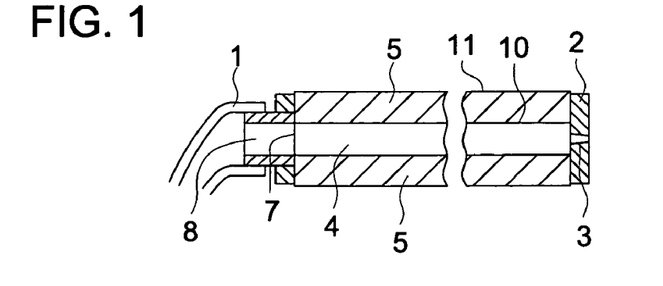
FIG. 1: A diagram illustrating a constitution of the liquid droplet ejection head of the first embodiment of the present invention
Figure 2:
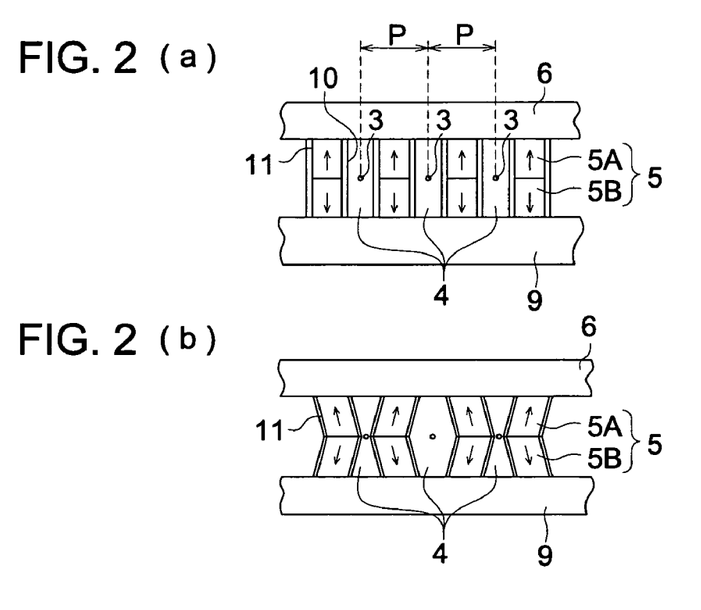
FIG. 2: A diagram illustrating a constitution of the liquid droplet ejection heads exhibiting multi-nozzles of the first embodiment of the present invention
Figure 3:
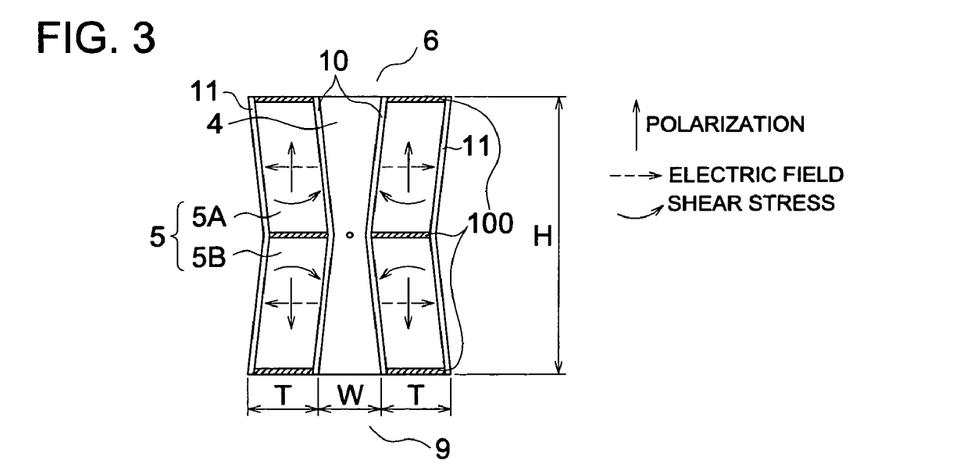
FIG. 3: A diagram illustrating motions of the liquid droplet ejection heads shown in FIG. 1 and FIG. 2

Below, the first embodiment of the liquid droplet ejection head of the present invention employing the above piezoelectric ceramic composition as the piezoelectric actuator of the shear mode type utilizing a piezoelectric $d_{15}$ constant is described with reference to FIG. 1 to FIG. 3. FIG. 1 is a diagram illustrating a constitution of the liquid droplet ejection head of the first embodiment of the present invention. FIG. 2 is a diagram illustrating a constitution of the liquid droplet ejection heads having multiple nozzles of the first embodiment of the present invention. FIG. 3 is a diagram illustrating motions of the liquid droplet ejection heads shown in FIG. 1 and FIG. 2.

In the liquid droplet ejection head of the present embodiment, many pressure chambers are arranged, each of which has a nozzle to eject a liquid and is separated by dividing walls. Some or all of the aforesaid dividing walls are constituted of a piezoelectric actuator of the shear mode type, and then, all or some of the surfaces of the dividing walls form an electrode onto which a driving pulse is applied. Application of the driving pulse to the above electrode causes a shear deformation on the above dividing wall, whereby pressure inside the above pressure chamber changes to result in ejection of droplets from the above nozzle which is formed at one end of the above pressure chamber.

In FIG. 1 to FIG. 3, each of numerals from 1 to 11 designates:

1: liquid tube
2: nozzle forming member
3: nozzle
4: pressure chamber
5: piezoelectric dividing wall (being a shear mode piezoelectric actuator)
6: cover plate
7: liquid supply port
8: shared liquid chamber
9: substrate, and
10 and 11: electrodes Pressure chamber 4 is formed of piezoelectric dividing wall 5, cover plate 6, and substrate 9.

First, two pieces of the above piezoelectric ceramic composition are prepared, which have been molded in a sheet form and then sintered to allow it to be polarized in the thickness direction. Substrate 9 and the two pieces of piezoelectric ceramic compositions, which are overlaid so that the direction of polarization thereof differ from each other, are pasted together above and below via adhesive 100. Then, the upper part of the laminated compositions is subjected to a cutting process employing a diamond blade in such a manner that all of the plurality of pressure chambers 4, exhibiting a groove-like structure, have the same form and are parallel to each other. Due to the above processing, adjacent pressure chambers 4 are divided by piezoelectric dividing walls 5 (being a shear mode piezoelectric actuator) which are polarized in the direction of the arrows. Then, after electrodes 10 and 11 are formed on piezoelectric dividing walls 5 via a plating method or a vapor-phase deposition method, cover plates 6 are pasted onto the upper surface, followed by nozzle forming members 2 being pasted onto the front surface.

FIG. 1 shows a liquid droplet ejection head exhibiting one unit of the pressure chamber and one piece of nozzle. However, in an actual liquid droplet ejection head, a plurality of pressure chambers 4, which are divided between cover plate 6 and substrate 9 by a plurality of piezoelectric dividing walls, are formed parallel to each other, one end of pressure chamber 4 is connected to nozzle 3, which is formed through nozzle forming member 2, and liquid supply port 7 located at the other end of pressure chamber 4 is connected to a liquid tank (not illustrated) by liquid tube 1 through shared liquid chamber 8. Driving pulse voltage is applied between electrode 10 and grounded electrode 11, both of which are formed to be in tight contact with piezoelectric dividing walls 5.

In FIG. 2(a), piezoelectric dividing wall 5 is constituted of two piezoelectric dividing walls 5A and 5B (being a shear mode piezoelectric actuator) in which the polarization direction differs from each other as shown by arrows. As shown in FIG. 2(a), when no driving pulse is applied to electrode 10, piezoelectric dividing walls 5A and 5B do not change their shapes. However, as shown in FIG. 2(b) and FIG. 3, when a driving pulse is applied to electrode 10, shear stress occurs due to the electric field in a direction perpendicular to the polarized direction of the piezoelectric dividing wall, which causes shearing strain at the joint surfaces of both piezoelectric dividing walls 5A and 5B. Due to the change of the pressure in pressure chamber 4 caused by the above shearing strain, some of the liquid which fill pressure chamber 4 are ejected via nozzle 3. The average amount of displacement Δ of the piezoelectric dividing wall and generated pressure P, at the time of ejection, are represented by the formulae below.

$$\Delta = (\text{piezoelectric } d_{15} \text{ constant}) \times H \times V/(4T), \text{ and}$$

$$P = (\text{piezoelectric } d_{15} \text{ constant}) \times H \times V/\{2TW(1/B)+(1/S)(dS/dP)\},$$

wherein, as shown in FIG. 3, H is the depth of pressure chamber 4, W is the width of pressure chamber 4, V is a driving pulse voltage, T is the thickness of piezoelectric dividing wall 5, B is a modulus of volume elasticity of the liquid, and S is the cross-sectional area of pressure chamber 4.

Supply of liquid from a liquid tank to a nozzle after droplets have been ejected is carried out through a liquid supply port and pressure chamber 4 by force of capillary action at the nozzle.

Piezoelectric dividing wall 5 in the liquid droplet ejection head employs a piezoelectric ceramic composition incorporating solid solution of a primary component represented by Formula (1) below, and a sub-component represented by Formula (2), also below, which is added in an amount of less than 1 mol % of the total amount of the solid solution.

$$\{Li_X(K_{1-Y}Na_Y)_{1-X}\}(Nb_{1-Z-W}Ta_ZSb_W)O_3, \quad \text{Formula (1)}$$

wherein x, y, z and W are within the ranges of $0 \leqq x \leqq 0.2$, $0 \leqq y \leqq 1$, $0 < z \leqq 0.4$, and $0 < w \leqq 0.2$, respectively.

$$ABO_3, \hspace{4cm} \text{Formula (2)}$$

wherein A represents Bi, and B represents at least any one of Fe, In, and Sc.

By employing a piezoelectric ceramic composition exhibiting a low temperature dependence of the piezoelectric $d_{15}$ constant such as described in the present embodiments as a piezoelectric dividing wall (being a shear mode piezoelectric actuator), a change of displacement properties of the piezoelectric actuator is small even if temperature change takes place, whereby liquid ejection properties remain stable.

Since the above piezoelectric ceramic composition contains no lead in its composition, toxic lead is not eluted off from the wastes thereof. Therefore, the above piezoelectric ceramic composition can be one which contains no lead and exhibits high safety.

The shear mode type piezoelectric actuator utilizing a piezoelectric $d_{15}$ constant employing the above piezoelectric ceramic composition can be applied to a liquid droplet ejection head below as a deformation example of the first embodiment of the liquid droplet ejection head of the present invention.

In the above deformation liquid droplet ejection head, a plurality of pressure chambers provided with nozzles are divided by dividing walls, and the above pressure chambers are formed by above two dividing walls, a wall combining the aforesaid two dividing walls, and a wall in which above nozzle is formed. And at least one of the above combining walls is constituted with the shear mode type piezoelectric actuator, and over the whole or some of the surfaces of the piezoelectric actuator, formed are electrodes to which a driving pulse is applied. Application of the driving pulse to the above electrodes causes shear deformation of the above piezoelectric actuator, whereby the pressure inside the above pressure chamber changes to result in ejection of liquid droplets from the above nozzle which is formed at one end of the above pressure chamber.

The Second Embodiment

Hereinafter, the second embodiment of the liquid droplet ejection head of the present invention, in which the above piezoelectric ceramic composition is employed as a push type piezoelectric actuator utilizing a piezoelectric $d_{31}$ constant, is described with reference to FIG. 4.

Figure 4:
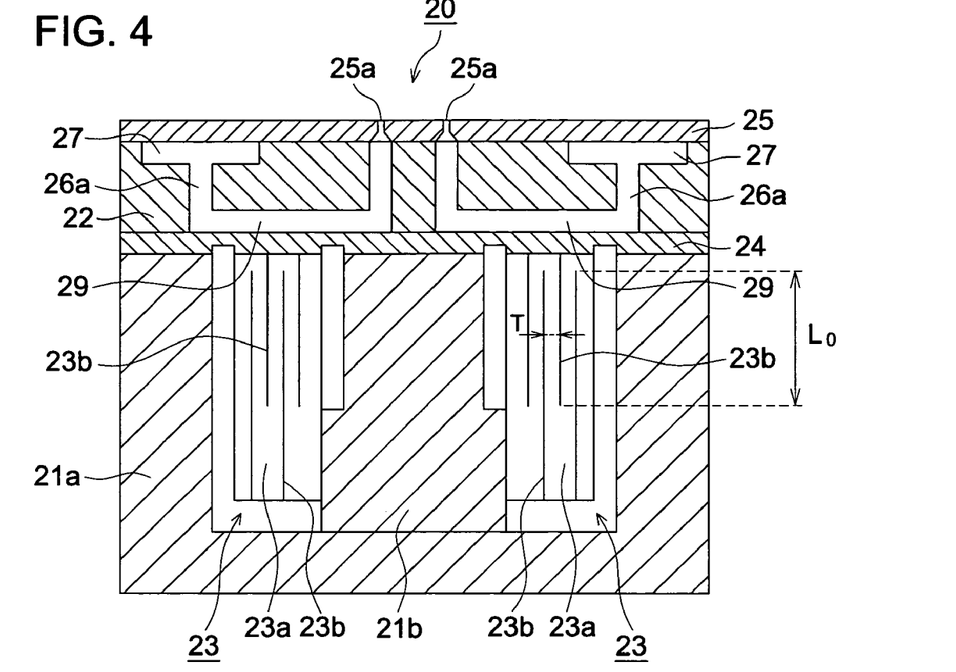
FIG. 4: A diagram illustrating a constitution of the liquid droplet ejection heads of the second embodiment of the present invention

FIG. 4 is a schematic cross-sectional diagram of a liquid droplet ejection head of a type such that the volume of a pressure chamber is altered by deformation due to expansion and contraction of a piezoelectric actuator which is provided on a wall of a pressure chamber.

At one end of base 21b, which is in a lower part of the figure, formed is a protruding portion at one side of the base, which portion fixes laminated body 23 comprising piezoelectric actuator 23a and electrode 23b (hereinafter described as laminated body 23) which will be described later. At the surface of an upper end of base 21b, fixed is vibrating plate 24 which separates pressure chamber 29 from laminated body 23.

Vibrating plate 24 is formed so as to readily respond to vibration of laminated body 23 by forming concave portions near places which make close contacts with laminated body 23. On the surface of vibrating body 23, fixed are a pressure chamber forming member as well as spacer member 22, which also functions as a supply board having liquid introducing port 26a. The area facing laminated body 23 is constituted to form a pressure chamber in conjunction with vibrating plate 24. Further, liquid introducing port 26a is formed, though it is not illustrated, such that the pressure chamber becomes narrower in the direction of pressure chamber 29 to restrict liquid flow.

On the surface of spacer member 22, fixed is nozzle plate 25, and there are provided a plurality of nozzle orifices coordinating with an array form of laminated body 23 in which each of piezoelectric actuators 23a and electrodes 23b is alternatively laminated in a layer form. Further, in a liquid supply section, liquid supply part 27 is formed in such a manner that opening parts, where nozzle orifices 25a in nozzle plate 25 are not provided, are sealed.

One end of laminated body 23 is fixed onto vibrating plate 24 in such a state that each of piezoelectric actuators 23a comprising above-described piezoelectric ceramic composition, which is molded in a sheet form and sintered to allow it to be polarized in a thickness direction, and electrodes 23b are alternatively laminated in a layer form, and the side part of the other end is fixed to the protruding portion of base 21b. The lower end of base 21b is fixed to fixing member 21a. Fixing member 21a supports vibrating plate 24, spacer member 22, and nozzle plate 25, and, through base 21b, brings an unfixed end of laminated body 23 (an upper end in the figure) into contact with vibrating plate 24. Further, as the figure clearly shows, base 21b is constituted such that one end of base 21b almost meets to a surface at an end of the unfixed end of laminated body 23, and the size of the other end of base 21b is such that it protrudes farther than the fixed end of laminated body 23. In liquid droplet ejection head exhibiting the above structure, when a voltage is applied between electrode 23b and electrode 23b located at both surfaces of each piezoelectric actuator 23a, laminated body 23 is stretched to the axial direction perpendicular in the electric field direction, and then, vibrating plate 24 which is fixed to the end of laminated body 23 is stretched and displaced in the direction of nozzle plate 25 to result in pressurizing pressure chamber 29. The liquid, which is subjected to a higher pressure due to decrease in volume of above pressure chamber 29, is ejected from nozzle orifice 25a as liquid droplets. At that time, the amount of displacement A of laminated body 23 is represented by the formula below.

$$\Delta = (\text{piezoelectric } d_{15} \text{ constant}) \times L0 \times V/T,$$

wherein, as shown in FIG. 4, L0 is the length of the active part, V is a driving pulse voltage, and T is the thickness of piezoelectric actuator 23a.

Supply of liquid from a liquid storage tank to a nozzle after liquid droplets have been ejected is carried out through a liquid supply port and pressure chamber 4 by force of capillary action of the nozzle.

Piezoelectric actuator 23a in the liquid droplet ejection head employs a piezoelectric ceramic composition incorporating a solid solution of a primary component represented by Formula (1) below and a sub-component represented by Formula (2), also below, which is added in an amount of less than 1 mol % of the total amount of the solid solution.

$$\{Li_X(K_{1-Y}Na_Y)_{1-X}\}(Nb_{1-Z-W}Ta_ZSb_W)O_3, \hspace{1cm} \text{Formula (1)}$$

wherein x, y, z and W are within the ranges of $0 \leqq x \leqq 0.2$, $0 \leqq y \leqq 1$, $0 < z \leqq 0.4$, and $0 < w \leqq 0.2$, respectively.

$$ABO_3, \hspace{4cm} \text{Formula (2)}$$

wherein A represents Bi, and B represents at least any one of Fe, In, and Sc.

By employing a piezoelectric ceramic composition exhibiting a low temperature dependence of the piezoelectric $d_{15}$ constant such as described in the present embodiments as a piezoelectric actuator, a change of displacement properties of the piezoelectric actuator is small even if temperature change takes place, and liquid ejection properties are stabilized.

Since the above piezoelectric ceramic composition contains no lead in its composition, toxic lead is not eluted off from the waste thereof. Therefore, the above piezoelectric ceramic composition can be one which contains no lead and exhibits high safety.

In the present embodiment, exemplified is a liquid droplet ejection head, in which the piezoelectric ceramic composition is employed as a push type piezoelectric actuator utilizing a piezoelectric $d_{31}$ constant, but the piezoelectric ceramic composition is not limited thereto. It can also be applied to a liquid droplet ejection head which is a deformation example of the second embodiment shown below.

Below, a deformation example of the second embodiment of the liquid droplet ejection head of the present embodiment employing the above piezoelectric ceramic composition as a push type piezoelectric actuator utilizing a piezoelectric $d_{33}$ constant will be described with reference to FIG. 5.

Figure 5:
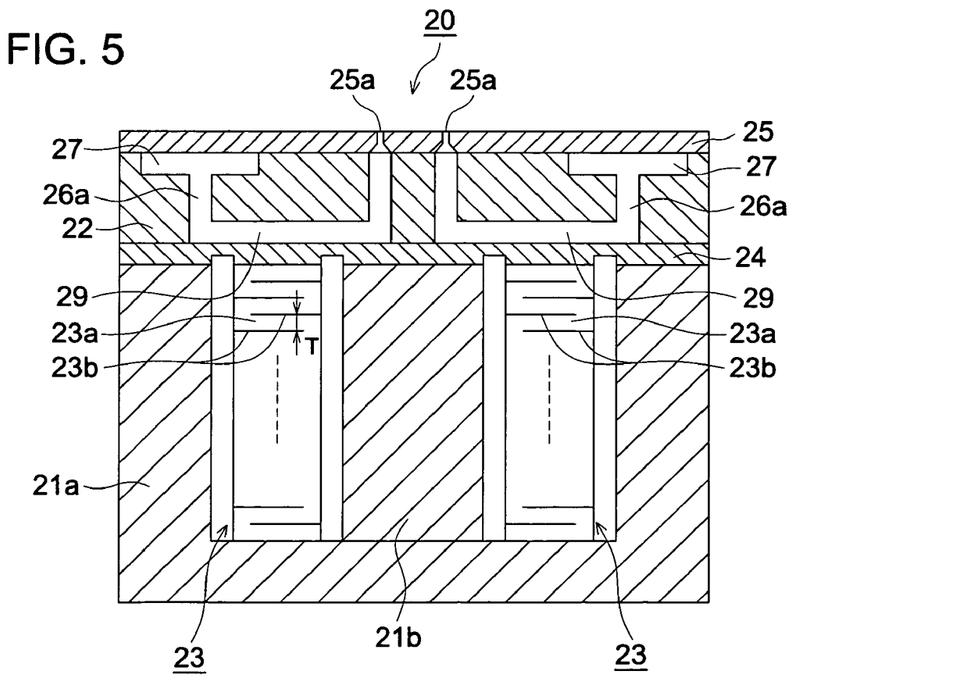
FIG. 5: A diagram illustrating a deformation example of a constitution of the liquid droplet ejection heads of the second embodiment of the present invention

In FIG. 5, with regard to the members exhibiting the same functions as the liquid droplet ejection head of the second embodiment in FIG. 4, the same symbols are used, and their detailed descriptions will be omitted. In the present deformation example, piezoelectric actuator 23a and electrode 23b are laminated along the length of laminated body 23, and one end of the longitudinal direction is secured to fixing member 21a. When a voltage is applied between electrode 23b and electrode 23b located on both surfaces of each piezoelectric actuator 23a, laminated body 23 is stretched in the electric field direction, and then, vibrating plate 24, which is fixed to one end of laminated body 23, is stretched and displaced toward the direction of nozzle plate 25, to result in compression of pressure chamber 29. The liquid, which is pressurized due to a decrease in volume of above pressure chamber 29, is ejected from nozzle orifice 25a as liquid droplets.

The Third Embodiment

Hereinafter, the third embodiment of the liquid droplet ejection head of the present invention, in which the above piezoelectric ceramic compositions is employed as a deflection type piezoelectric actuator utilizing a piezoelectric $d_{31}$ constant, will be described with reference to FIG. 6.

Figure 6:
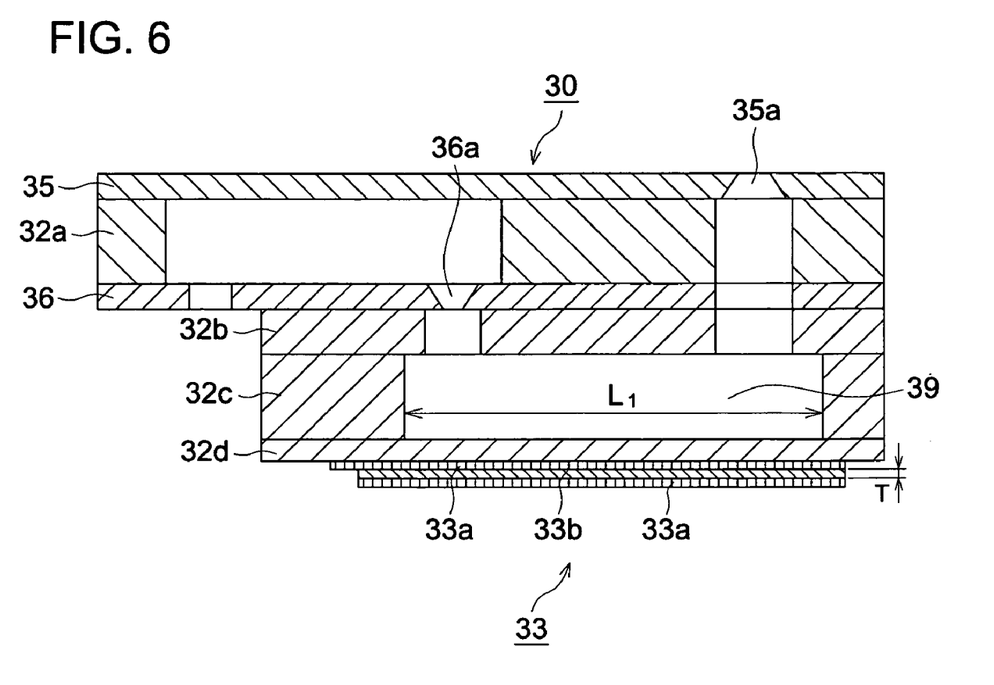
FIG. 6: A diagram illustrating a constitution of the liquid droplet ejection head of the third embodiment of the present invention

FIG. 6 is a schematic cross-sectional diagram of a liquid droplet ejection head of a type similar to the second embodiment in which the volume of a pressure chamber is altered by deformation due to expansion and contraction of a piezoelectric actuator which is provided on a wall of a pressure chamber, but it's structure differs from that of the second embodiment.

As a specific example, for example, the above liquid droplet ejection head is formed in such a manner that metallic nozzle plate 35, in which a plurality of nozzle orifices 35a are formed, and metallic supply plate 36, which is a member being provided on the liquid introduction side of pressure chamber 39 to restrict liquid flow and in which plate a plurality of liquid introduction ports 36a are provided. The metallic nozzle plates 35 and metallic supply plate 36 sandwich flow channel plate 32a between them and these plates were adhered to each other, whereby a liquid pressure chamber, which introduces liquid into above nozzle orifice 35a, and a liquid supply flow channel, which introduces liquid into above liquid introduction port 36a, are separately formed inside the head; and further, a member, which is formed by a laminated body of plates 32b, 32c, and 32d, made of metal or synthetic resin, and having a plurality of openings corresponding to each above nozzle orifice 35a and liquid introducing port 36a, is laminated onto the above structure, which are then bonded to form an integrated structure, whereby pressure chambers 39 are formed behind each of above nozzle orifice 35a and liquid introducing port 36a; and in addition, laminated body 33 is firmly fixed on a wall part of pressure chamber 39, which laminated body 33 is composed of lower electrode 33a, piezoelectric actuator 33b, which is made of above piezoelectric ceramic composition which was molded in a sheet form and sintered to allow it to be polarized in its thickness direction, and upper electrode 33a.

Liquid droplet ejection head 30 is structured so that liquid supplied to pressure chamber 39 is ejected through nozzle orifice 35a which is formed in nozzle plate 35. More specifically, droplet ejection head 30 is structured such that nozzle plate 35 and supply plate 36, which is a member exhibiting an opening at the liquid introducing side of the pressure chamber and restricting liquid flow, are laminated with flow channel plate 32a being sandwiched between them, and bonded by adhesives to form an integrated structure.

A plurality of nozzle orifices 35a (not illustrated) for liquid ejection are formed in nozzle plate 35, as well as passing-through holes in the board thickness direction are formed in supply plate 36 and flow channel plate 32a at places corresponding to each of nozzle orifices 35a featuring a cavity being larger by a predetermined amount than that of the aforesaid nozzle orifice 35a.

In supply plate 36, a plurality of liquid introducing ports 36a (orifice holes) are formed, and window parts, which are provided at flow channel plate 32a, are covered with nozzle plate 35 and supply plate 36 from the both sides of the window, whereby a liquid supply flow channel, which is connected to each liquid introducing port 36a, is formed between above nozzle plate 35 and supply plate 36. Further, supply plate 36 is provided with a supply port which supplies liquid to a liquid supply flow channel, which liquid is introduced from a liquid storage tank.

In general, it is preferable that plastics or metals such as nickel and stainless steel are employed to form each of plates 35, 36 and 32a with a high dimensional accuracy. Liquid introducing port 36a is preferably formed as a tapered shape, as is illustrated in the figure, whose diameter decreases along the direction of liquid flow.

On the other hand, on the opposite side of supply plate 36, a structure such that closing plate 32d and connecting plate 32d are laminated with spacer plate 32c being sandwiched between them is formed in an integrated fashion.

Within connecting plate 32b, each of the connecting openings is formed at places corresponding to a hole and liquid introducing port 36a, both of which are formed in supply plate 36.

Within spacer plate 32c, a plurality of longitudinal rectangular window parts are formed. For each window part, spacer plate 32c is laminated to connecting plate 32b so that each of connecting openings provided in connecting plate 32b will feature an opening.

On the surface of above spacer plate 32c opposing to the side where connecting plate 32b is laminated, closing plate 32d is laminated, and the opening of the window part is covered with above closing plate 32d, whereby pressure chamber 39 is formed so that liquid is connected to the exterior through each of the connecting openings.

Closing plate 32d, spacer plate 32c, and connecting plate 32b are preferably constituted of ceramic. For aforesaid ceramic materials, alumina or zirconia are preferably employed in terms of formability. The thickness of closing plate 32d is preferably 50 μm or less, more preferably about 3 to 12 μm. The thickness of connecting plate 32b is preferably 10 μm or more, more preferably 50 μm or more. The thickness of spacer plate 32c is preferably 50 μm or more, more preferably 100 μm or more.

Pressure chamber 39 thus formed is typically formed as an integrated sintered product of ceramics, but it may be made by bonding the respective plates employing adhesives.

Each of the portions on the exterior surface of closing plate 32d corresponding to pressure chambers 39 for each liquid is provided with laminated bodies 33. The laminated body 33, which is composed of lower part electrode 33a, piezoelectric actuator 33b, and upper part electrode 33a, is firmly fixed to closing plate 32d.

In this case, for closing plate 32d, a ceramic plate made of zirconium oxide as a primary component is preferably employed.

By incorporating, via addition, one compound of yttrium oxide, cerium oxide, magnesium oxide, and calcium oxide, or a combination thereof, into zirconium oxide, the zirconium oxide is partially or wholly stabilized. The incorporating amount by addition of each compound into zirconium oxide is preferably from 2 to 7 mol % of yttrium oxide, from 6 to 15 mol % of cerium oxide, and from 5 to 12 mol % of magnesium oxide or calcium oxide. Of these, it is particularly preferable to employ yttrium oxide as a partial stabilizer, and in which case, it is desirable to add from 2 to 7 mol %, more preferably from 2 to 4 mol %. The zirconium oxide, in which yttrium oxide is added and incorporated in an amount of the above range, is partially stabilized in a crystal whose major crystalline phase is tetragonal, or in a mixed crystal comprised mainly of cubic and tetragonal resulting in excellent base characteristics.

Materials for electrode films 33a and 33a are not particularly limited as long as they are conductors which can withstand an oxidation atmosphere of a high degree of thermal treatment temperature or sintering temperature, and they may be a metal element or an alloy, or may be a mixture of ceramics or glass with a metal or an alloy, or further, they may be conductive ceramics. Preferably employed are electrode materials whose primary components are precious metals such as platinum, palladium, and rhodium which exhibit a high melting point or alloys such as silver/palladium, silver/platinum, or platinum/palladium.

Of closing plate 32d, spacer plate 32c, and connecting plate 32d, all of which constitutes laminated body 33, above connecting plate 32b, as illustrated in FIG. 6, is laminated to supply plate 36 to form an integrated structure employing adhesives.

Liquid droplet ejection head 30 is formed in such a manner that via an operation of piezoelectric actuator 33b on closing plate 32d, serving as a vibrating plate, liquid which is introduced through a liquid supply flow channel is supplied from liquid introducing port 36a into pressure chamber 39, so that the liquid passes a hole and is ejected from nozzle orifice 35a.

Piezoelectric actuator 33b, which is laminated to closing plate 32d, serving as a vibrating plate, is polarized in the thickness direction. Application of voltage, between upper part electrode, 33a and lower part electrode 33a, both of which are arranged above and below each other, shrinks piezoelectric actuator 33b in the longitudinal direction (that is, in L1 direction in FIG. 6), whereby closing plate 32d and piezoelectric actuator 33b cause a bending deformation, as is a bimetal, which alters the volume of pressure chamber 39, resulting in ejected liquid droplets from nozzle orifice 35a.

The amount of displacement A of piezoelectric actuator 33b, at the time of ejection, is represented by the formula below.

wherein, as shown in FIG. 4, L1 is the length of pressure chamber 39, V is a driving pulse voltage, and T is the thickness of piezoelectric actuator 33b.

Supply of liquid, from a liquid storage tank to a nozzle after liquid droplets have been ejected, is carried out through a liquid supply port and pressure chamber 39 due to a force of capillary action of the nozzle.

Piezoelectric actuator 33b in the liquid droplet ejection head employs piezoelectric ceramic compositions incorporating a solid solution of a primary component represented by Formula (1) below and a sub-component represented by Formula (2), also below, which is added in an amount of less than 1 mol % of the total amount of the solid solution.

Formula (1)

wherein x, y, z and W are within the ranges of $0 \leqq x \leqq 0.2$, $0 \leqq y \leqq 1$, $0 < z \leqq 0.4$, and $0 < w \leqq 0.2$, respectively.

$$ABO_3,\qquad \text{Formula (2)}$$

wherein A represents Bi, and B represents at least any one of Fe, In, and Sc.

By employing a piezoelectric ceramic composition exhibiting a low temperature dependence of the piezoelectric $d_{31}$ constant such as described in the present embodiments as a piezoelectric actuator, a change of displacement properties of the piezoelectric actuator is small even if temperature change takes place, and liquid ejection properties are stabilized.

Since the above piezoelectric ceramic composition contains no lead in its composition, toxic lead does not eluted off from the waste thereof. Therefore, the above piezoelectric ceramic composition can be one which contains no lead and exhibits high safety.

The liquid droplet ejection head of the present invention can be widely utilized for not only inkjet heads which are employed for inkjet printers, but industrial applications such as creations of electronic circuits, production of color filters for liquid crystal displays, and production of organic EL displays.

EXAMPLES

Hereinafter, the piezoelectric ceramic compositions relating to examples of the present invention are produced, and the characteristics thereof were evaluated.

The method for the production is described in detail below.

As raw materials of the piezoelectric ceramic composition, extremely pure $Li_2CO_3$, $Na_2CO_3$, $K_2CO_3$, $Nb_2O_5$, and $Sb_2O_5$ at a purity of at least 99% were prepared. These raw materials were sufficiently dried, and then compounded in such amounts that the composition was of a stoichiometric ratio of x=0.04, y=0.52, z=0.1, and w=0.06 in the above formula $\{Li_X(K_{1-Y}Na_Y)_{1-X}\}(Nb_{1-Z-W}Ta_ZSb_W)O_3$, that is the above formula became $\{Li_{0.04}(K_{0.48}Na_{0.52})_{0.96}\}(Nb_{0.84}Ta_{0.1}Sb_{0.06})O_3$.

The compounded raw materials were blended via a ball mill in anhydrous acetone over 24 hours, and then dried to produce a mixture.

Next, the above mixture was calcined at 750° C. over 5 hours, which mixture was then subjected to pulverization via a ball mill over 24 hours. The pulverized mixture was dried to produce calcined powder of the primary component.

As a sub-component, extremely pure $Bi_2O_3$, $Fe_2O_3$, $Sc_2O_3$, and $In_2O_3$ at a purity of at least 99% were prepared. These raw materials were compounded in such amounts that the composition was of a stoichiometric ratio to form the above formula $ABO_3$ (wherein A is Bi, and B is any one of Fe, Sc, and In), that is, the above formula became $BiInO_3$, $BiScO_3$, or $BiFe_3$ to produce three mixed powders of the sub-component.

The temporarily powder of the primary component and each of the three mixed powders of the sub-component were compounded in such amounts that the composition was of a stoichiometric ratio of v=0.002, 0.004, 0.006, or 0.01 in the above formula $(\{Li_{0.04}(K_{0.48}Na_{0.52})_{0.96}\}(Nb_{0.84}Ta_{0.1}Sb_{0.06})O_3)_{1-v}(ABO_3)_v$.

As shown in Table 1, of the resultant piezoelectric ceramic compositions, a sample in which no sub-component was added was denoted as No. 1. Samples in which $BiInO_3$, as a sub-component, was added in the amount of 0.2, 0.4, 0.6, and 1 mol % were denoted as No. 2, No. 3, No. 4, and No. 5, respectively. Similarly, samples in which $BiScO_3$ as a sub-component was added were denoted as No. 6 to No. 9 in the order of added amount, and samples in which $BiFeO_3$, as a sub-component, was added were denoted as No. 10 to No. 13 in the order of added amount.

As shown in Table 2, the sample in which no sub-component was added in the above formula $\{Li_{0.2}(K_{0.5}Na_{0.5})_{0.8}\}(Nb_{0.84}Ta_{0.3}Sb_{0.06})O_3$ was denoted as No. 14. Similarly, the samples in which $BiFeO_3$, as a sub-component, was added were denoted as No. 15 to No. 17 in the order of added amount. The sample in which no sub-component was added in the above formula $\{Li_{0.1}(K_{0.5}Na_{0.5})_{0.9}\}(Nb_{0.64}Ta_{0.3}Sb_{0.06})O_3$ was denoted as No. 18. The sample in which $BiFeO_3$, as a sub-component, was added in an amount of 0.6 mol % was denoted as No. 19.

TABLE 1

| | Sample No. | Primary component | Molar Ratio | Sub-component | Molar Ratio | Δd |
|---|---|---|---|---|---|---|
| Comp. | 1 | $\{Li_x(K_{1-y}Na_y)_{1-x}\}(Nb_{1-z-w}Ta_zSb_w)O_3$ | 1 | Not Added | 0 | 0.42 |
| Inv. | 2 | x = 0.04, y = 0.52, z = 0.1, w = 0.06 | 0.998 | $BiInO_3$ | 0.002 | 0.28 |
| Inv. | 3 | | 0.996 | | 0.004 | 0.31 |
| Inv. | 4 | | 0.994 | | 0.006 | 0.30 |
| Comp. | 5 | | 0.99 | | 0.01 | No Highly Dense Sintered Substance Provided |
| Inv. | 6 | | 0.998 | $BiScO_3$ | 0.002 | 0.32 |
| Inv. | 7 | | 0.996 | | 0.004 | 0.30 |
| Inv. | 8 | | 0.994 | | 0.006 | 0.26 |
| Comp. | 9 | | 0.99 | | 0.01 | No Highly Dense Sintered Substance Provided |
| Inv. | 10 | | 0.998 | $BiFeO_3$ | 0.002 | 0.32 |
| Inv. | 11 | | 0.996 | | 0.004 | 0.28 |
| Inv. | 12 | | 0.994 | | 0.006 | 0.24 |
| Comp. | 13 | | 0.99 | | 0.01 | No Highly Dense Sintered Substance Provided |

Comp.: Comparative Example, Inv.: Present Invention

TABLE 2

| | Sample No. | Primary component | Molar Ratio | Sub-component | Molar Ratio | Δd |
|---|---|---|---|---|---|---|
| Comp. | 14 | $\{Li_x(K_{1-y}Na_y)_{1-x}\}(Nb_{1-z-w}Ta_zSb_w)O_3$ | 1 | Not Added | 0 | 0.57 |
| Inv. | 15 | x = 0.2, y = 0.5, z = 0.1, w = 0.06 | 0.998 | $BiFeO_3$ | 0.002 | 0.50 |
| Inv. | 16 | | 0.996 | | 0.004 | 0.50 |
| Inv. | 17 | | 0.994 | | 0.006 | 0.48 |
| Comp. | 18 | $\{Li_x(K_{1-y}Na_y)_{1-x}\}(Nb_{1-z-w}Ta_zSb_w)O_3$ | 1 | Not Added | 0 | 0.42 |
| Inv. | 19 | x = 0.1, y = 0.5, z = 0.3, w = 0.06 | 0.994 | $BiFeO_3$ | 0.006 | 0.38 |

Comp.: Comparative Example, Inv.: Present Invention

A piezoelectric ceramic composition in which each component was compounded was mixed via a ball mill in anhydrous acetone over 24 hours, and then dried to produce a mixture.

Next, the above mixture was calcined at from 700 to 800° C. over 5 hours, which was then subjected to pulverization via a ball mill over 24 hours. Subsequently, polyvinyl butyral as a binder was added thereto, and then the mixture was granulated and subjected to pressure molding. The pressure molding was carried out in such a manner that the granulated substance, made of the pulverized substance, was molded in the form of pellets via uniaxial pressing, and then the resultant pellets were re-molded via a cold isostatic press (CIP) at a pressure of 1 ton/cm$^2$.

The compacted pellets thus produced were sintering at from 1,000 to 1,300° C. over one hour to produce a sintered product. The temperature, at which the highest density was yielded, was selected between 1,000 and 1,300° C. as the sintering temperature. A highly dense sintered substance was not provided from a mixture exhibiting the above formula $\{(Li_{0.04}(K_{0.48}Na_{0.52})_{0.96}\}(Nb_{0.84}Ta_{0.1}Sb_{0.06})O_3$ to which the amount of the sub-component added was 1 mol %.

Further, the crystalline phase of the resulted sintered substance was identified via x-ray diffraction analysis. The generation of a solid solution in the sintered substance composed of the piezoelectric ceramic composition of the present invention was confirmed from the fact that the diffraction peak was indicative of single-phase structure of a perovskite and successively shifted with the increase of the amount of the sub-component.

The obtained sintered product was cut to a predetermined size, which was then subjected to parallel grinding to about 0.5 mm in thickness, followed by formation of gold electrodes via sputtering on both sides thereof. Subsequently, in silicone oil at about from 80 to 150° C., direct current voltage of from 1 to 6 kV/mm was applied between the electrodes to be polarized in the thickness direction to produce a piezoelectric ceramic composition.

Subsequently, on the obtained piezoelectric ceramic composition, a temperature dependence of a piezoelectric $d_{31}$ constant in a temperature range of from −30 to 80° C. was determined. The piezoelectric $d_{31}$ constant was determined via a resonance-anti-resonance method employing an impedance analyzer (type 4294A: manufactured by Agilent Technologies Inc.). Specifically, employing an impedance analyzer and a thermostat bath, after the sample was held for a predetermined time at every 2 to 5° C. interval in a range of from −30 to 80° C., the piezoelectric $d_{31}$ constant was determined at each temperature.

The rate of change Δd of the piezoelectric $d_{31}$ constant between 10 and 80° C. was calculated from the obtained graph of temperature dependence. The Δd was calculated by a formula below based on values measured at the temperatures of T1 (° C.) at which the piezoelectric $d_{31}$ constant reaches its maximum value and T2 (° C.) at which the piezoelectric $d_{31}$ constant reaches its minimum value. The temperature dependence was evaluated with respect to the Δd, and it was judged that the larger the Δd, the larger the temperature dependence of the piezoelectric $d_{31}$ constant.

$$\Delta d = (\text{piezoelectric } d_{31} \text{ constant at } T1 - \text{piezoelectric } d_{31} \text{ constant at } T2)/(\Delta T),$$

wherein, ΔT (in absolute value) is a temperature difference between T1 and T2.

Figure 7:
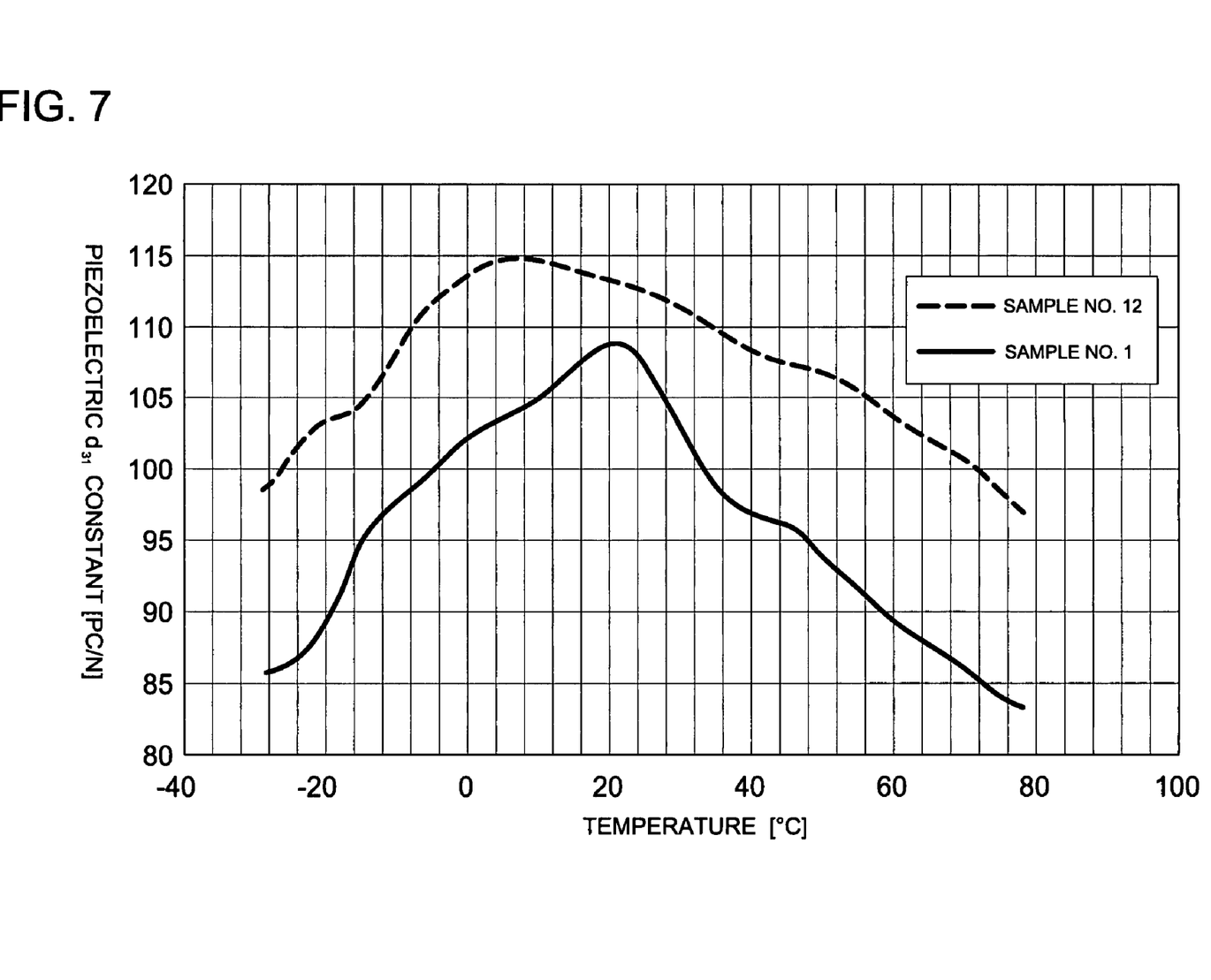
FIG. 7: A figure showing a temperature dependence of a piezoelectric $d_{31}$ constant of a piezoelectric ceramic composition

FIG. 7 shows a temperature dependence of the piezoelectric $d_{31}$ constant measured on samples No. 1 and No. 12.

Regarding sample No. 1, the maximum piezoelectric $d_{31}$ constant in a range of from 10 to 80° C. reaches about 108 pc/N at 21° C., and the minimum is about 83 pc/N at 80° C. These values give as much as 0.42 of the rate of change Δd of the piezoelectric $d_{31}$ constant between 10 and 80° C. It is assumed from FIG. 7 that the phase transition temperature from orthorhombic to tetragonal is about 21° C. Further, it has been confirmed that the crystalline phase is orthorhombic at 10° C. and tetragonal at 30° C. from the above-described result of crystalline phase identification of the sintered substance via x-ray diffraction analysis (XRD).

On the other hand, regarding sample No. 12, the maximum piezoelectric $d_{31}$ constant in a range of from 10 to 80° C. reaches about 114 pc/N at 10° C., and the minimum is about 97 pc/N at 80° C. These values give as little as 0.24 of the rate of change Δd of the piezoelectric $d_{31}$ constant between 10 and 80° C. It is assumed from FIG. 7 that the phase transition temperature from orthorhombic to tetragonal is about 5° C. Further, it has been confirmed that the crystalline phase is orthorhombic at 0° C. and tetragonal at 20° C. from the above described result of crystalline phase identification of the sintered substance via x-ray diffraction analysis (XRD).

Base on the studies by the inventors, it was found that the temperature dependence of the piezoelectric constant largely varies in the vicinity of the transition temperature of the piezoelectric ceramic composition, and then, the transition temperature of the piezoelectric ceramic composition is required to be lowered from the vicinity of the using temperature range where the piezoelectric ceramic composition is used to allow the characteristics thereof to be stabilized.

The piezoelectric ceramic composition of sample No. 1, in which a sub-component is not added, exhibits the transition temperature of about 21° C. which is near the room temperature, and therefore, the temperature dependence of the piezoelectric constant is large in the using temperature range where the piezoelectric ceramic composition is used.

On the other hand, it is assumed that the transition temperature of the piezoelectric ceramic composition of sample No. 12, in which a sub-component is added to form solid solution, decreases to about 5° C. which is away from the using temperature range where the piezoelectric ceramic composition is used, whereby the temperature dependence of the piezoelectric constant in the using temperature range where the piezoelectric ceramic composition is used can be significantly lowered.

The other samples of the present invention exhibit a tendency on the temperature dependence similar to that of sample No. 12 in FIG. 7, which indicates that each of the samples of the present invention exhibits smaller temperature dependence of the piezoelectric constant due to addition of the sub-component.

Results calculated from thus obtained graphs on the temperature dependence of the rate of change Δd of the piezoelectric $d_{31}$ constant between 10 and 80° C. on samples No. 1 to No. 19 are given in Table 1 and Table 2.

As Table 1 and Table 2 show, the piezoelectric ceramic compositions of the present invention exhibit a small temperature dependence of the piezoelectric $d_{31}$ constant. This allows that, with a droplet ejection head which is provided with a piezoelectric actuator employing the aforesaid piezoelectric ceramic composition, the piezoelectric actuator exhibits a small change in displacement properties leading to stabilized ejection properties of liquid even if temperature change takes place.

Though, in the present examples, evaluated results of the rate of change Δd of the piezoelectric $d_{31}$ constant between 10 and 80° C. were shown, the similar evaluations were also carried out on the rate of change Δd of the piezoelectric $d_{31}$ constant between 10 and 50° C., and it was confirmed that similar effect can be given.

Though, in the present examples, evaluated results of the rate of change Δd of the piezoelectric $d_{31}$ constant were shown, the similar evaluations were also carried out on the piezoelectric $d_{15}$ constant and the piezoelectric $d_{33}$ constant, and it was confirmed that similar effect can be given.

Further, in the present examples, $\{Li_{0.04}(K_{0.48}Na_{0.52})_{0.96}\}(Nb_{0.84}Ta_{0.1}Sb_{0.06})O_3$, $\{Li_{0.2}(K_{0.5}Na_{0.5})_{0.8}\}(Nb_{0.84}Ta_{0.1}Sb_{0.06})O_3$, or $\{Li_{0.1}(K_{0.5}Na_{0.5})_{0.9}\}(Nb_{0.64}Ta_{0.3}Sb_{0.06})O_3$ was employed as a primary component, but any components, as long as they are represented by a formula $\{(Li_X(K_{1-Y}Na_Y)_{1-X}\}(Nb_{1-Z-W}Ta_ZSb_W)O_3$, wherein x, y, z and w are within the ranges of $0 \leq x \leq 0.2$, $0 \leq y \leq 1$, $0 < z \leq 0.4$, and $0 < w \leq 0.2$, respectively, may be applicable as the primary component and can give similar effects.

In the present examples, a sub-component was added as a form of mixed powder, but addition of a sub-component as calcined powder, which was produced in advance by temporarily calcinating the sub-component, also can give similar effects.

What is claimed is:

1. A liquid droplet ejection head comprising;
a piezoelectric actuator using a piezoelectric ceramic composition incorporating a solid solution of a primary component represented by Formula (1) and a sub-component represented by Formula (2), which is added in an amount of less than 1 mol % of the total amount of the solid solution, $$\{Li_X(K_{1-Y}Na_Y)_{1-X}\}(Nb_{1-Z-W}Ta_ZSb_W)O_3, \quad \text{Formula (1)}$$

wherein x, y, z and W are within the ranges of $0 \leq x \leq 0.2$, $0 \leq y \leq 1$, $0 < z \leq 0.4$, and $0 < w \leq 0.2$, respectively, $$ABO_3, \quad \text{Formula (2)}$$

wherein A represents Bi, and B represents at least any one of Fe, In, and Sc.

2. The liquid droplet ejection head of claim 1, wherein the solid solution exhibits a perovskite structure.

3. The liquid droplet ejection head of claim 1,
wherein the piezoelectric actuator is employed as a shear mode piezoelectric actuator utilizing a piezoelectric $d_{15}$ constant.

4. The liquid droplet ejection head of claim 1,
wherein the piezoelectric actuator is employed as a deflection piezoelectric actuator utilizing a piezoelectric $d_{31}$ constant.

5. The liquid droplet ejection head of claim 1,
wherein the piezoelectric actuator is employed as a push piezoelectric actuator utilizing a piezoelectric $d_{31}$ constant.

6. The liquid droplet ejection head of claim 1,
wherein the piezoelectric actuator is employed as a push piezoelectric actuator utilizing a piezoelectric $d_{33}$ constant.

7. The liquid droplet ejection head of claim 2,
wherein the piezoelectric actuator is employed as a shear mode piezoelectric actuator utilizing a piezoelectric $d_{15}$ constant.

8. The liquid droplet ejection head of claim 2,
wherein the piezoelectric actuator is employed as a deflection piezoelectric actuator utilizing a piezoelectric $d_{31}$ constant.

9. The liquid droplet ejection head of claim 2,
wherein the piezoelectric actuator is employed as a push piezoelectric actuator utilizing a piezoelectric $d_{31}$ constant.

10. The liquid droplet ejection head of claim 2,
wherein the piezoelectric actuator is employed as a push piezoelectric actuator utilizing a piezoelectric $d_{33}$ constant.

* * * * *